US008286059B1

(12) United States Patent
Huang

(10) Patent No.: US 8,286,059 B1
(45) Date of Patent: Oct. 9, 2012

(54) WORD-SERIAL CYCLIC CODE ENCODER

(75) Inventor: ChengKuo Huang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 1311 days.

(21) Appl. No.: 11/970,964

(22) Filed: Jan. 8, 2008

Related U.S. Application Data

(60) Provisional application No. 60/883,895, filed on Jan. 8, 2007.

(51) Int. Cl.
*H03M 13/00* (2006.01)
(52) U.S. Cl. ......................................... 714/781; 714/757
(58) Field of Classification Search .................. None
See application file for complete search history.

(56) References Cited

U.S. PATENT DOCUMENTS

| 5,140,596 A * | 8/1992 | Weldon, Jr. | 714/762 |
| 5,402,429 A * | 3/1995 | Stessens | 714/781 |
| 5,694,405 A * | 12/1997 | Kuwahara | 714/752 |
| 5,912,905 A * | 6/1999 | Sakai et al. | 714/784 |
| 5,948,117 A * | 9/1999 | Weng et al. | 714/784 |
| 6,115,837 A * | 9/2000 | Nguyen et al. | 714/769 |
| 6,598,201 B1 * | 7/2003 | Cheng et al. | 714/784 |
| 6,978,415 B1 * | 12/2005 | Weng | 714/781 |
| 7,823,049 B2 * | 10/2010 | Tsai | 714/781 |
| 8,069,390 B2 * | 11/2011 | Lin | 714/758 |

OTHER PUBLICATIONS

Guido Albertengo and Riccardo Sisto, "Parallel CRC Generation," Oct. 1990, pp. 63-71.

* cited by examiner

*Primary Examiner* — Ajay Bhatia
*Assistant Examiner* — Daniel McMahon

(57) ABSTRACT

A cyclic code encoding device or encoder that contains word registers rather than single bit registers, and can process input bits and parity bits as input words and parity words. The cyclic code encoder can add input words to output register words, generating a feedback word, which can be supplied through a feedback loop that selectively transmits feedback words through weight arrays and intra-register adders, to the input of word registers. A controller can operate the cyclic code encoder in either an input mode or an output mode during which feedback words can be sequentially transmitted on the feedback loop and the states of the word registers can be updated and the final states of the word registers can be sequentially shifted out of the output word register as parity words, respectively.

17 Claims, 9 Drawing Sheets

WORD-SERIAL CYCLIC CODE ENCODER

INCORPORATION BY REFERENCE

This application claims the benefit of U.S. Provisional Application No. 60/883,895, "Parallel Cyclic Code Encoder Design (12-bit)" filed on Jan. 8, 2007, including all cited references which are incorporated herein by reference in their entirety.

BACKGROUND

Error correcting codes are digital codes that can generally be used to detect and/or correct errors in transmitted information bits. For example, error correcting codes can include redundant bits, e.g., check bits or parity bits, that can indicate errors in transmitted information and correct information bit errors. Data storage and digital communication systems typically use error correcting codes to operate reliably.

One category of error correcting codes includes block error correcting codes. Block error correcting codes can take a given number of information bits, k, and generate an n-bit long codeword or codevector by including n-k parity bits. The length of a codevector and number of information bits the codevector uses can be denoted [n, k].

Cyclic codes are types of block error correcting codes in which a cyclic shift of a codevector can produce another codevector. For example, if an n-bit codevector from a cyclic code is regarded as being wrapped into a circle, then any right or left shift of the codevector can produce another codevector.

Cyclic codes can be encoded with bit-serial encoders that use single bit registers and single bit combinational logic. The single bit registers can be arranged in a string to make a shift register. Data can propagate from single bit register to single bit register along the shift register. For each clock cycle, the most significant single bit register can output one bit.

A cyclic code encoder's incoming information bits can be combined with a register output to generate a feedback signal that is injected at the input of each single bit register. The bit-serial cyclic encoder's combinational logic can 1) multiply the feedback signal by binary weights equal to generator polynomial coefficients, then 2) supply the weighted feedback signals to the single bit registers. The combinational logic can weight or multiply the feedback signal by a different generator coefficient at the input to each single bit register. A binary generator coefficient is a multiplier that connects or disconnects the feedback signal to a register input to multiply the feedback signal by one or zero, respectively.

FIG. 1 shows a conventional bit-serial [n, k] binary cyclic encoder 100 that transfers k information bits 101 to the encoder output in the following order: $U_{k-1}, U_{k-2}, \ldots, U_0$, where the $U_{k-1}$ bit is the most significant bit of information bits 101. Information bits 101 can be described equally well in either the polynomial form $U(x)=U_0+U_1x+\ldots+U_{k-2}x^{k-2}+U_{k-1}x^{k-1}$ or in vector form as a k-element long vector $U=[U_0, U_1, \ldots, U_{k-2}, U_{k-1}]$. In the vector form, the most significant information bit can be shown on the right; this convention conveniently matches the order in which information bits emerge from a bit-serial cyclic encoder.

After encoder 100 accepts the k information bits, encoder 100 can generate N=n–k parity bits 107, and then output the parity bits after the information bits. The parity bits can be arranged as a parity bit vector $P=[P_0, P_1, \ldots, P_{N-2}, P_{N-1}]$ that is appended to the information bit vector to form a codevector 102. Codevector 102 can be represented as an n-element long vector, V, in the form:

$$V=[V_0, V_1, \ldots, V_{n-2}, V_{n-1}]=[P_0, P_1, \ldots, P_{N-2}, P_{N-1}, U_0, U_1, \ldots, U_{k-2}, U_{k-1}] \quad \text{EQ. 1}$$

As shown, the information bits, U, in EQ. 1 appear explicitly as the most significant bits of codevector 102. An error correcting code in which the information bits appear explicitly is called a systematic code. All cyclic codes can be made systematic. Encoder 100 of FIG. 1 is systematic because encoder 100 accepts and places information bits 101 so that information bits 101 appear explicitly in adjacent, sequential positions in codevector 102. A clock signal (not shown) synchronizes the flow of information bits 101.

A multiplexer 104 routes information bits 101 to codevector 102 when an information/parity selection 103 is asserted. Multiplexer 104 routes parity bits 107 from a register 110 when information/parity selection 103 is de-asserted. Information bits 101 appear serially in codevector 102, with the most significant information bit, $U_{k-1}$, first followed by sequentially generated (bit-serial) parity bits, starting with $P_{N-1}$.

Each bit of information bits 101 is added to a parity bit 107 to generate a feedback signal 109. The initial value of parity bit 107 is zero because each register 110, 120, . . . 170 is initialized to zero before the arrival of information bits 101. An opening gate 106 generates a zero feedback signal that initializes each register 110, 120, . . . , 170 to zero before a new codevector 102 is generated.

Encoder 100 uses a digital feedback loop to generate the parity bits. The feedback loop is closed only while the information bits stream out of the encoder. Afterward, the feedback loop opens and the parity bits emerge serially from the output of the shift register and are routed to the codevector 102 through multiplexer 104.

An adder 108 generates feedback signal 109 by combining each bit of information bits 101 and parity bit 107 by using modulo-2 arithmetic (i.e., each addition of two binary numbers produces a sum that is either a zero or a one). Adder 108, as well as adders 112, 122, 132, 142, 152, and 162, can each be implemented using an exclusive-OR gate (XOR). The output of an exclusive OR is "1" when the inputs of the gate differ and "0" when the inputs agree.

An encode command 105 closes gate 106 while information bits 101 are being routed to codevector 102. Gate 106 provides (active) feedback signal 109 to generator coefficients or weight components 111, 121, 131, 141, 151, 161, and 171 as long as gate 106 is closed and zero otherwise. Gate 106 remains closed during the time information bits 101 are being routed to codevector 102.

After information bits 101 have been routed to codevector 102, encode command 105 opens gate 106 to open the feedback loop. Thereafter registers 170, 160, 150, etc. each shift their contents towards register 110. Simultaneously, register 110 sends parity bits 107 to multiplexer 104.

Registers 170, 160, 150, etc. are each loaded with a zero sequentially after the feedback loop opens. The zeroing process starts with the least significant register, e.g. register 170, which outputs a zero on the first clock pulse after gate 106 opens. Each register (170, 160, 150, etc.) fills with zero on successive clock pulses until all registers contain zero and all parity bits have been routed to codevector 102 by multiplexer 104.

When gate 106 is closed, feedback signal 109 encounters weight components 111, 121, . . . 171, (i.e., 111-171) en route to each register. Each weight component 111-171 can be thought of as a binary multiplier, i.e., a "0" or "1" multiplier that respectively corresponds to an open or closed connection. Accordingly, particular connections which implement of some weight components 111-171 can be absent while other connections can provide feedback signal 109 to adders 112, 122, ... 162.

The bit-serial cyclic encoder of FIG. 1 generates the parity bits by 1) weighting the feedback signal by generator or weight coefficients 111-171, 2) combining the weighted feedback with register contents, and 3) shifting the combination into the registers. In operation, while the feedback path is closed, generator or weight coefficients each multiply the cyclic encoder's feedback signal by either a zero (0) or one (1) weight, the weighted feedback signal is added to any previous shift register output, then the sum is provided to the next shift register's input. The generator or weight coefficients 111-171 in FIG. 1 can be called $g_i$, where $0 \leq i \leq N = n-k-1$, and are taken as the respective coefficients of the cyclic code generator polynomial:

$$g(x) = g_0 + g_1 x + \ldots + g_{J-1} x^{J-1} + g_J x^J \ldots + g_{N-3} x^{N-3} + g_{N-2} x^{N-2} + g_{N-1} x^{N-1} + x^N.$$  EQ. 2

The maximum clock speed of bit-serial cyclic encoders can be constrained by shift register data setup time and combinational logic gate delay for circuitry in a critical path of the feedback loop. The critical path is the path containing the longest latency or signal delay.

Conventional bit serial encoders, e.g., encoders that generate and output parity bits one at a time, have a critical path with two binary adders, e.g., two XORs, and one AND gate. For each information bit received, the first XOR adds the previous parity bit to the information bit, thereby forming the feedback signal. The feedback signal propagates through a second intra-register adder (XOR) to supply an input to a register in the shift register. The critical path of a bit-serial cyclic encoder therefore incurs two XOR delays. The critical path time accounts for these two XOR delays, plus the propagation delay for an AND gate that can apply a programmable generator coefficient, plus the setup time for a register. The equation for the critical path delay for a programmable bit serial encoder is therefore:

$$t_{1bit} = 2 t_{XOR} + t_{AND} + t_{SETUP}$$  EQ. 3

Since one parity bit is generated per clock cycle, then a clock speed of 1 GHz will generate 1 parity bit per clock period, e.g., 1 nanosecond (ns). However, the propagation delays and setup time of the combinational logic and registers may be a substantial fraction of the clock period and may limit the top speed or maximum clockable rate of a bit-serial cyclic encoder.

SUMMARY

In contrast to bit-serial cyclic encoders, the information and parity bits can be aggregated into W-bit wide words to form a parallel cyclic encoder. The information words and parity words of a parallel cyclic encoder can be generated by using a single W-bit wide word register and a lookup table. The lookup table receives each new information word as the information word arrives. The lookup table output is stored in the word register when a clock pulse arrives and the word register output is thereby updated. The updated word register output is combined with a new information word. The lookup table and word register form a digital feedback loop containing just a lookup table and a single, word-wide register. The digital feedback loop accepts information words at the input and generates codevector words as the output. This digital feedback loop forms a single-register parallel cyclic encoder.

A cyclic code encoding device or encoder can contain word registers rather than single bit registers and can process input bits and parity bits as input words and parity words. The cyclic code encoder can receive an input word at input adder to add the input word to the state of an output word register and generate a corresponding feedback word. The cyclic code encoder can also include an adder located between the input of the output word register and another word register.

The inputs to each word register can be supplied through a feedback loop that selectively transmits weighted feedback words to the word registers through adders at the input to each word register. The feedback loop can also include weight arrays located between the input adder and the input to each word register word register.

A controller can operate the cyclic code encoder in either an input mode or an output mode. During the input mode, feedback words can be sequentially transmitted on the feedback loop and the states of the word registers can be updated. During the output mode, final states of the word registers can be sequentially shifted out of the output word register as parity words. The parity words can be shifted out in the order of most significant to least significant and the final state of the output word register can be the most significant parity word and the final state of another word register can be the least significant parity word.

The cyclic code encoder can contain more that two word registers. Specifically, the cyclic code encoder can contain one or more intermediate word registers located between the output of a least significant word register and the output word register. The input of each intermediate word register can be preceded by an intermediate weight array in the feedback loop starting at the input adder.

During the input mode, the cyclic code encoder can sequentially transmit feedback words on the feedback loop. The state of intermediate word register or registers can be updated by the weighted feedback words. During the output mode, the final state of the intermediate word register or registers can be shifted out of the output word register as a parity word. An intermediate adder can be coupled between the input of the intermediate word register and the second word register.

A gate can enable or disable the feedback loop during input mode or output mode, respectively. The gate can transmit the feedback word from the input adder to the weight arrays during input mode. The controller can cause the gate to close to transmit feedback words from the input adder to the weight arrays during the input mode whereas, during the output mode, the controller can cause the gate to open.

The cyclic code encoder can also include a multiplexer that transmits input words to both the input adder and a codevector during the input mode. The multiplexer transmits parity words from the output word register to the codevector during the output mode.

The first weight array and second weight array can each contain a number of weight coefficients equal to the square of the register word width so that each weighted feedback word can contain a number of bits equal to the square of the register word width. In addition, the first adder can contain a number of modulo-2 adders equal to the square of the register word width.

A least significant adder can couple weighted feedback words from the second weight array to the input of the second word register. The least significant adder can contain a number of modulo-2 adders equal to the square of the register word width less the register word width.

While it is possible to fix or hardwire the weight coefficients of weight arrays that implement a specific error correcting code or to initialize the cyclic code encoder, it is also possible to program the weight arrays to adjust, or select a different, error correcting code. In order to program a selected error correcting code, a set of multipliers can apply binary weights to feedback words to generate weighted feedback words that are coupled to the input of word registers, including the output word register.

The disclosed method for encoding cyclic codes can permit operation in either an input mode or output mode. In the input mode, a state of an output word register can be added to an input word to generate a corresponding feedback word, the feedback word can be transmitted back to the output word register and another word register.

The feedback word can be weighted by an associated weight array prior to the feedback word being received by the each word register. The state of each word register can then be updated based on the weighted feedback word received and the state of a preceding word register. After the controller switches from input mode to output mode, the final states of the word registers can be sequentially shifted out of the output word register as parity words.

During the input mode, arriving input words can be transmitted to both the input adder and a codevector that holds the input words and subsequent parity words.

Word registers can be arranged as a word-structured shift register. Accordingly, during the input mode, the state of each word register can depend on the state of preceding word registers and, during the output mode, the final state of word registers can be sequentially shifted to the output word register and subsequently transmitted from the output word register as a parity word.

The weighting function that can be applied to the feedback word during the input mode can be implemented by multiplying the feedback word by a set of weight coefficients. There can be a number of weights or multiplication operations equal to the square of the register word width. The weighted feedback word width can differ from the feedback word width. Accordingly, an adder at the input to a word register can add a weighted feedback word and a register word that have unequal word widths.

The disclosed method for cyclic code encoding can program a set of weight coefficients of the weight arrays from initial values of the weight coefficients. The programmed weight arrays can implement a selected error correcting code that can be different from the initial error correcting code. In order to program the weight arrays, the disclosed method can apply a set of binary weights to the feedback word to generate weighted feedback words.

The disclosure also describes a storage device that can contain a memory medium and an interface that includes a first word register and a second word register. The interface can also include art input adder that receives input words and outputs corresponding feedback words, an adder between the input of the first word register and the second word register. The interface can also include a feedback loop that selectively transmits weighted feedback words to the second word register and the first adder. The interface can further include a first weight array in the feedback loop between the input adder and the input of the first word register and a second weight array between the input adder and the input of the second word register. The interface can also include a controller that can cause the storage device to operate in an input mode and an output mode.

During the input mode of the storage device, feedback words can be sequentially transmitted on the feedback loop. The states of the first word register and second word register can be updated during the input mode.

During the output mode of the storage device, final states of the first and second word registers can be shifted out of the first word register as parity words. The information and parity words can form a codevector that can be written to the memory medium by the storage device. The parity words can be the final state of word registers when the storage device mode changes from input mode to output mode. The first word register can supply a most significant parity word and the final state of the second word register can supply a least significant parity word.

In addition to the first and second word registers, there can be at least one intermediate word register located between the output of the second word register and the input of the first word register. There can also be 1) an intermediate weight array in the feedback loop between the input adder and the input of the intermediate word register and 2) an intermediate adder between the input of the intermediate word register and the second word register.

During the input mode, while feedback words are being sequentially transmitted on the feedback loop, the state of the intermediate word register can be updated by feedback words supplied through the intermediate weight array and intermediate adder. During the output mode, a final state of the intermediate word register can be shifted out of the first word register as a parity word.

The input mode and output mode can be switched according to control of a gate that is included in the feedback loop. The gate can transmit the feedback word from the input adder to the first and second weight arrays during the input mode. The control signal can be supplied by a controller that can cause the gate to close and transmit feedback words from the input adder to the weight arrays during the input mode and open during the output mode.

In addition to the gate, the storage device can include a multiplexer that can transmit input words to both the input adder and a codevector during the input mode and parity words from the first word register to the codevector during the output mode.

The first weight array and the second weight array that weight the feedback word can each contain a number of weight coefficients equal to the square of the register word width. In addition, the first adder and each weighted feedback word can contain a number of modulo-2 adders equal to the square of the register word width.

A second adder can be located between the second weight array and the input of the second word register. Unlike the first adder, the second adder can contain a number of modulo-2 adders equal to the square of the register word width less the register word width.

The first weight array and the second weight array can be programmable elements. Programming the weight arrays can change the error correcting code or select an error correcting code different from an initial or default error correcting code. Programmable weight arrays can be implemented with multipliers or gates that apply binary weights to feedback words to generate weighted feedback words which can be coupled to the input of word registers.

The storage device can record to a memory medium which is a magnetic disk, a magnetic tape, an optical disk, or a magneto-optical disk.

BRIEF DESCRIPTION OF THE DRAWINGS

The disclosure will make reference to the accompanying figures, wherein like numerals represent like elements, and wherein.

DETAILED DESCRIPTION OF EMBODIMENTS

Figure 1:
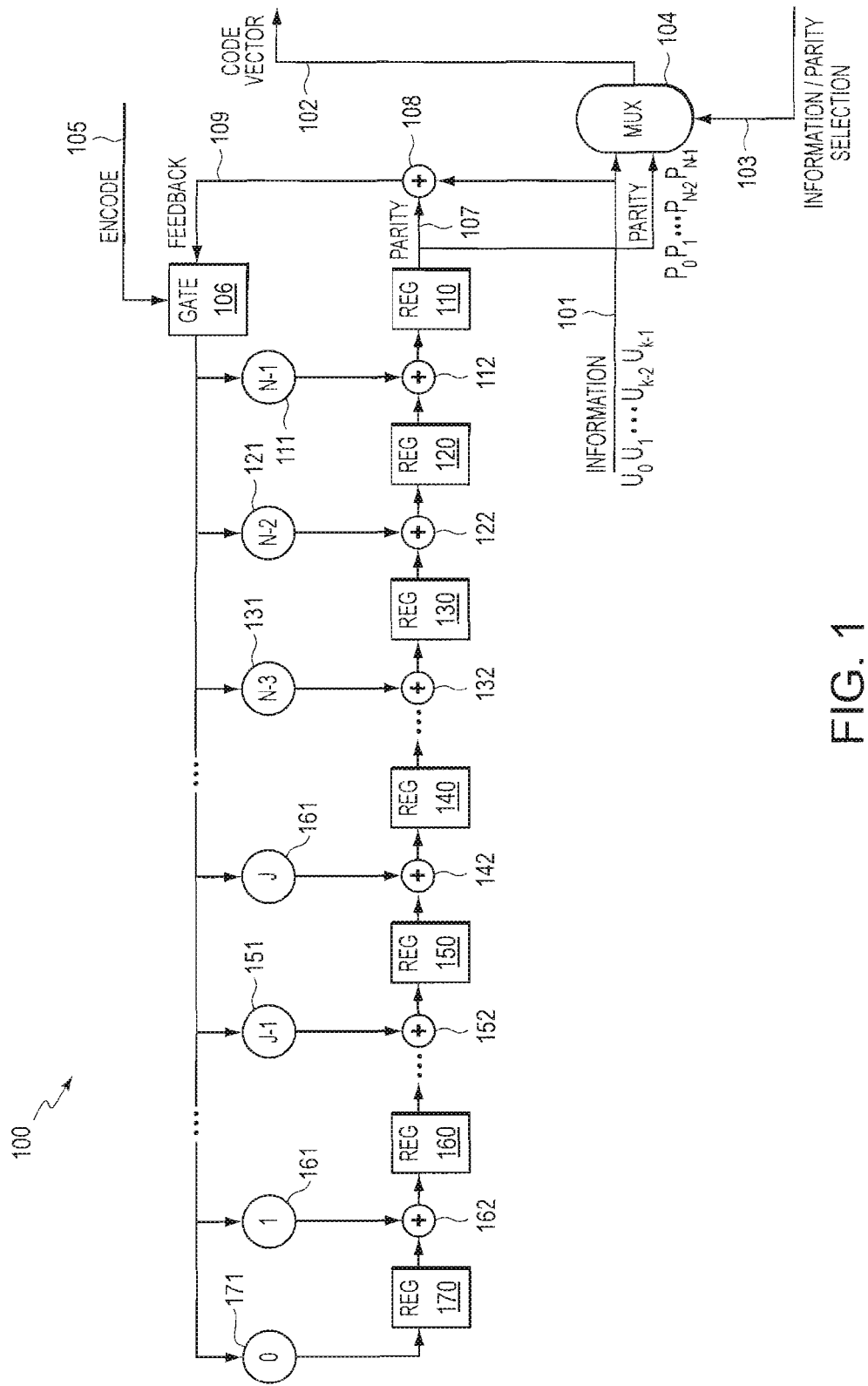
FIG. 1 shows an exemplary [n, k] bit-serial binary cyclic encoder.
Figure 2:
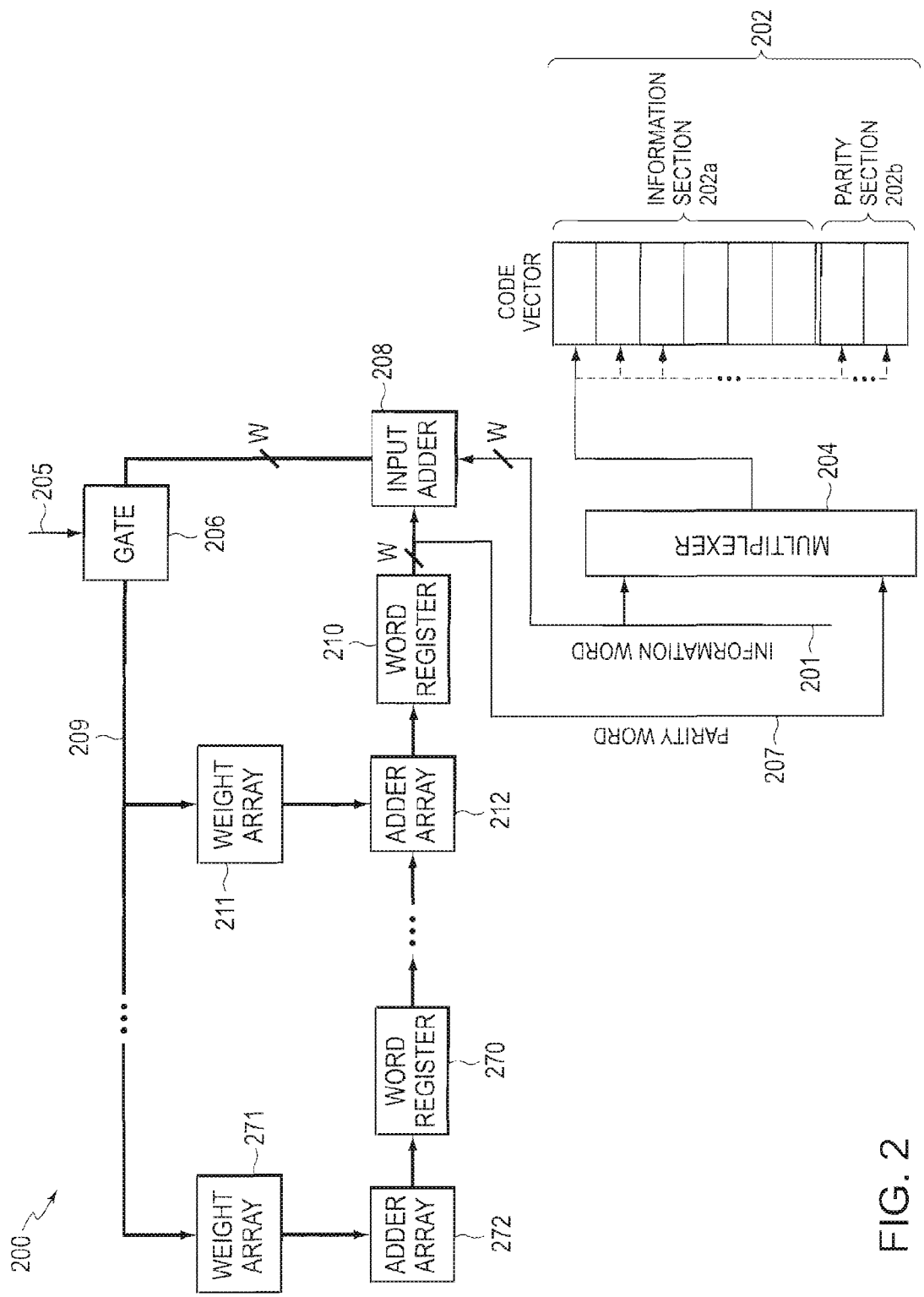
FIG. 2 shows an exemplary word-serial cyclic encoder with combinational feedback and word-structured registers.

In FIG. 2, is an exemplary diagram of a word-serial cyclic code encoder 200. As shown in FIG. 2, word-serial cyclic code encoder 200 can include an input adder 208, a feedback path 209, a multiplexer 204, a gate 206, word registers 210 and 270, weight arrays 211 and 271, and adder arrays 212 and 272. An information word 201 input and a width of the inputs and outputs of word registers 210 and 270 can be W bits wide. The input and register word width W can be two or more bits, and in an exemplary case, W can be 12 bits.

In one implementation, input adder 208 has two word-wide inputs and one word-wide output. One input of input adder 208 can be connected to the output of word register 210 and the other input of adder 208 can be connected to a W bit wide bus (not shown) which also provides information word 201 to a first input of multiplexer 204. The output of input adder 208 can be connected to gate 206. A second input of multiplexer 204 can be connected to an output of word register 210, and the output of multiplexer 204 can transmit information and parity words to respective portions of a codevector 202.

The output of gate 206 can be connected to weight arrays 211 and 271 through feedback loop 209. Weight arrays 211 and 271 can be the first and last weight arrays in a set of weight arrays. Additional weight arrays are indicated by ellipsis in FIG. 2 with one weight array per word register.

Each weight of weight arrays 211 and 271 can be a binary multiplier, i.e., either a connection from one of the W inputs to one of the W outputs of the weight array or no connection. The weight arrays 211 and 271 can be fixed or programmable binary multipliers. Fixed binary multiplication can be implemented by providing physical connects/disconnects or by providing programmable connections such as with AND gates. In other words, the word-serial cyclic code encoder 200 can be implemented with either programmable weight arrays, and the like, or with fixed weight arrays. In either case, each weight array 211,271 can interconnect W inputs to W outputs using $W^2$ weights, fusible links, hardwired interconnections, gated interconnections, programmable cell interconnections, and the like.

The output of each weight array 211 and 271 can be connected to an adder array 212 and 272, respectively. In one implementation, word-serial cyclic code encoder 200 can include additional adder arrays and word registers. Such additional adder arrays and word registers are indicated by ellipsis in FIG. 2 with one adder array per word register. As shown in FIG. 2, weight array 211 and adder array 212 connect gated feedback signals from gate 206 to the input of word register 210. Likewise, weight array 271 and adder array 272 connect gated feedback signals from gate 206 to the input of word register 270.

As shown in FIG. 2, adder array 212 precedes the most significant, i.e., first-to-output, word register 210. Adder array 212 and any other adder arrays indicated by ellipsis can contain $W^2$ binary adders or XORs.

As shown in FIG. 2, adder array 272 precedes the least significant, i.e., last-to-output, word register 270. Adder array 272 can be a simplified array with fewer elements than adder array 212 or other adder arrays indicated by ellipsis. Weight array 271 can contain $W^2-W$ binary adders or XORs.

As with weight arrays 211 and 271, each of adder array 212 and 272 can be a fixed or a programmable array. Each weight array 211,271 can accept two W-bit inputs and output one W-bit output and can be implemented using XORs, programmable cell structures, programmable logic arrays, field programmable gate arrays, NAND cell arrays, and the like. Likewise, each weight array 211,271 and corresponding adder array can be subsumed into a programmable logic unit using any suitable programmable array technology. Sets of weight array and adder array pairs can be aggregated into a larger programmable array that connects a W-bit wide feedback path from gate 206 to the W-bit wide inputs of each word register, such as word registers 210 and 270.

The exemplary word-serial cyclic code encoder 200 can operate as a gated feedback loop that uses 1) a plurality of word registers rather than a single word register, and 2) combinational logic or programmable logic with one weight array and adder array per word register. Word-serial cyclic code encoder 200 can generate parity words when a controller (not shown) causes encode command 205 to close gate 206. Closing gate 206 can create a path for feedback that is referred to herein as the feedback loop. The controller can cause word-serial cyclic code encoder 200 to switch from an input mode, in which information words 201 are loaded into the feedback loop and output to a portion of codevector 202, and an output mode, in which the generated parity words are output to another portion of codevector 202. For example, in one implementation, word-serial cyclic code encoder 200 can output one or more parity words 207 serially to a parity section 202b of codevector 202 when encode command 205 is de-asserted.

Encode command 205 can be asserted during the time that information word 201 is supplied to input adder 208 by an external bus (not shown). Information word 201 can be serially loaded into an information section 202a of codevector 202 while encode command 205 is asserted. Each W-bit wide information word 201 can be sequentially loaded into a W-bit wide portion of information section 202a.

While encode command 205 is asserted, the output of gate 206 can be a gated feedback signal that is supplied to weight arrays 211, 271, and any additional weight arrays indicated by ellipsis.

Encode command 205 can be asserted during an input mode of operation, in which the binary weighted feedback signals are added by adder array 212 to the input of an immediately preceding word register and supplied as a summed input signal to word register 210. The state of word register 210 can be updated in synchrony with a clock signal. The number of bits per weighted feedback word can be unequal to the word width of a word register. In one implementation, the output of word register 270 (or the state of word register 270, which can be updated in synchrony with a clock signal) and the output of weight array 211 can be summed by adder array 212 and presented to the input of word register 210. In an exemplary case, weight array 211, adder array 212, and word register 210 can be preceded by a weight array, adder array, and word register as indicated by ellipsis, and the input to adder array 212 can be taken from weight array 211 and an intermediate word register (not shown).

Encode command 205 can be de-asserted by the controller during an output mode of operation. During the output mode of operation, multiplexer 204 can output or transmit parity words 207 to codevector 202. The parity words 207 can be the final state of each word register, i.e., the state of each word register when gate 206 opens and feedback stops. The final state of each word register can then be sequentially transmitted through word register 210 and multiplexer 204 to a portion of codevector 202.

In order to discuss the operation of word-serial cyclic code encoder 200 in additional detail, consider the properties of word-serializable or word configurable cyclic codes. These codes can obey the relation:

$$[n, k] = [(j+i) \cdot W, i \cdot W] \quad \text{EQ. 4}$$

where "W" can denote the number of bits in the word, "i" can denote a positive integer number of information words to be protected by the cyclic code, and "j" can denote the number of parity words. The integer j>0 in all cases of interest, $j \cdot W = N = n-k$ parity bits, $k = i \cdot W$, and W>1 for word-serial operation by definition.

Not all error correcting codes can operate with word-structured registers. Table 1 gives examples of some codes that can be word-structured. Some [n, k] codes can be word-structured directly because n–k and k have a common factor. For example, the BCH [15, 5] code can use a 5 bit word. In this case, the 5 bit input word can be output first, followed by two 5 bit parity words.

Some error correcting codes cannot be word-structured directly, but can be modified to form an extended code that can be word-structured. For example, primitive BCH codes have a code or block length of $n = 2^m - 1$. The code length can be extended by one bit so that the code length is a power of 2, i.e., $2^m$, by multiplying its generator polynomial by the factor (1+x). In other words, an extra or overall parity bit can be incorporated in the block code and the parity-extended code can remain cyclic. The resulting extended code can be word-structured if $2^m - k$ and k have common multiple greater than one. For example, extended Hamming $[2^m, 2^m - 1 - m]$ codes can be word structured with a 2 bit word width whenever m is odd.

TABLE 1

[n, k] values for selected word-serializable codes

| Codevector Length, n | Information Bits, k | Word Size (bits) | Notes and/or Example Generator Polynomial g(x) |
|---|---|---|---|
| 8 | 4 | 2, 4 | $1 + x^2 + x^3 + x^4$, Extended Hamming, also $1 + x + x^2 + x^4$, Extended Hamming |
| 15 | 5 | 5 | BCH $1 + x + x^2 + x^4 + x^5 + x^8 + x^{10}$ |
| 15 | 3 | 3 | BCH |
| 21 | 6 | 3 | BCH |
| 22 | 6 | 2 | Extended BCH |
| 32 | 26 | 2 | $(1 + x)(1 + x^2 + x^5)$, Extended Hamming |
| 32 | 16 | 2, 4, 8, 16 | $(1 + x)(1 + x + x^2 + x^3 + x^5 + x^7 + x^8 + x^9 + x^{10} + x^{11} + x^{15})$ |
| 48 | 36 | 2, 3, 4, 6, 12 | 12 bit word-structurable cyclic |
| 48 | 24 | 2, 3, 4, 6, 8, 12 | 12 bit word-structurable cyclic |

TABLE 1-continued

[n, k] values for selected word-serializable codes

| Codevector Length, n | Information Bits, k | Word Size (bits) | Notes and/or Example Generator Polynomial g(x) |
|---|---|---|---|
| 128 | 120 | 2, 4, 8 | $(1 + x)(1 + x^3 + x^7)$, Extended Hamming |
| 128 | 106 | 2 | $(1 + x)(1 + x + x^5 + x^6 + x^7 + x^8 + x^{11} + x^{12} + x^{14} + x^{15} + x^{17} + x^{18} + x^{21})$ |
| 512 | 502 | 2 | Extended Hamming |
| 2040 | 1560 | 2, 3, 4, 5, 6, 10, 12, 15, 20 | 12 bit word-structurable cyclic |
| 2048 | 1952 | 2, 4, 8, 16, 32 | 16 bit word-structurable cyclic |

In order to demonstrate generating a combinational network for a cyclic code, consider a two-bit word version of an [8,4] cyclic code from Table 1. In this exemplary case, a [7,4] Hamming code with a generator polynomial of $g_c(x) = 1 + x^2 + x^3$ is parity extended by multiplying $g_c(x)$ by (1+x). The generator polynomial for the resulting [8,4] cyclic code is:

$$g(x) = (1 + x^2 + x^3)(1+x) = 1 + x + x^2 + x^4. \quad \text{EQ. 5}$$

As an example, consider encoding the information vector U=[0101] (i.e., $U(x) = x + x^3$) using $g(x) = 1 + x + x^2 + x^4$. Using either polynomial division or a generator matrix in systematic form, the codevector corresponding to U is found to be V=[1111 0101]. In other words, from right to left, i.e., from most significant to least significant, the first four bits of V are the information vector, U, which are followed by four parity bits, 1111.

Figure 3:
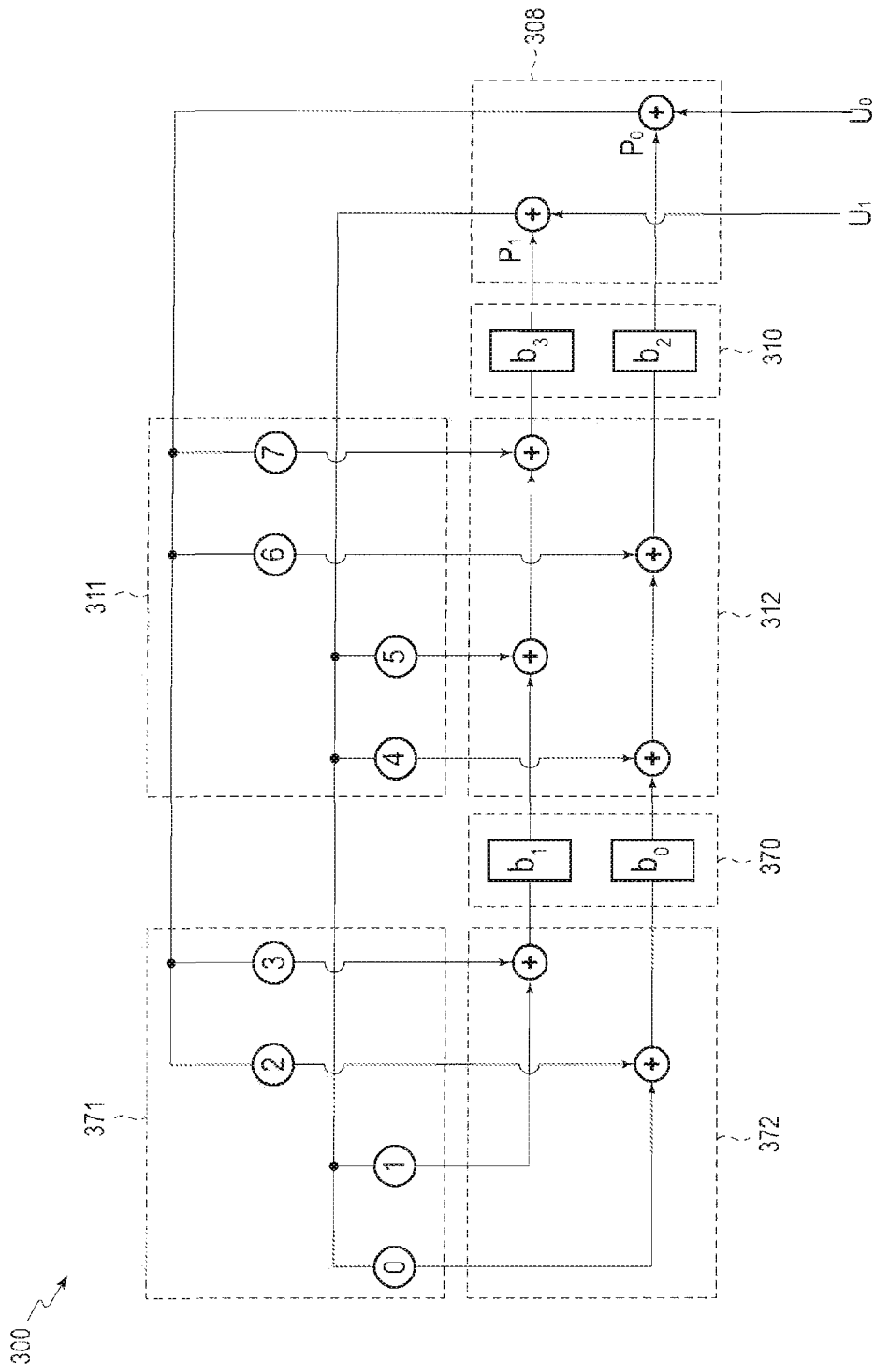
FIG. 3 shows an exemplary [4+2·i, 2·i] cyclic code encoder using W=2 bit words.
Figure 5:
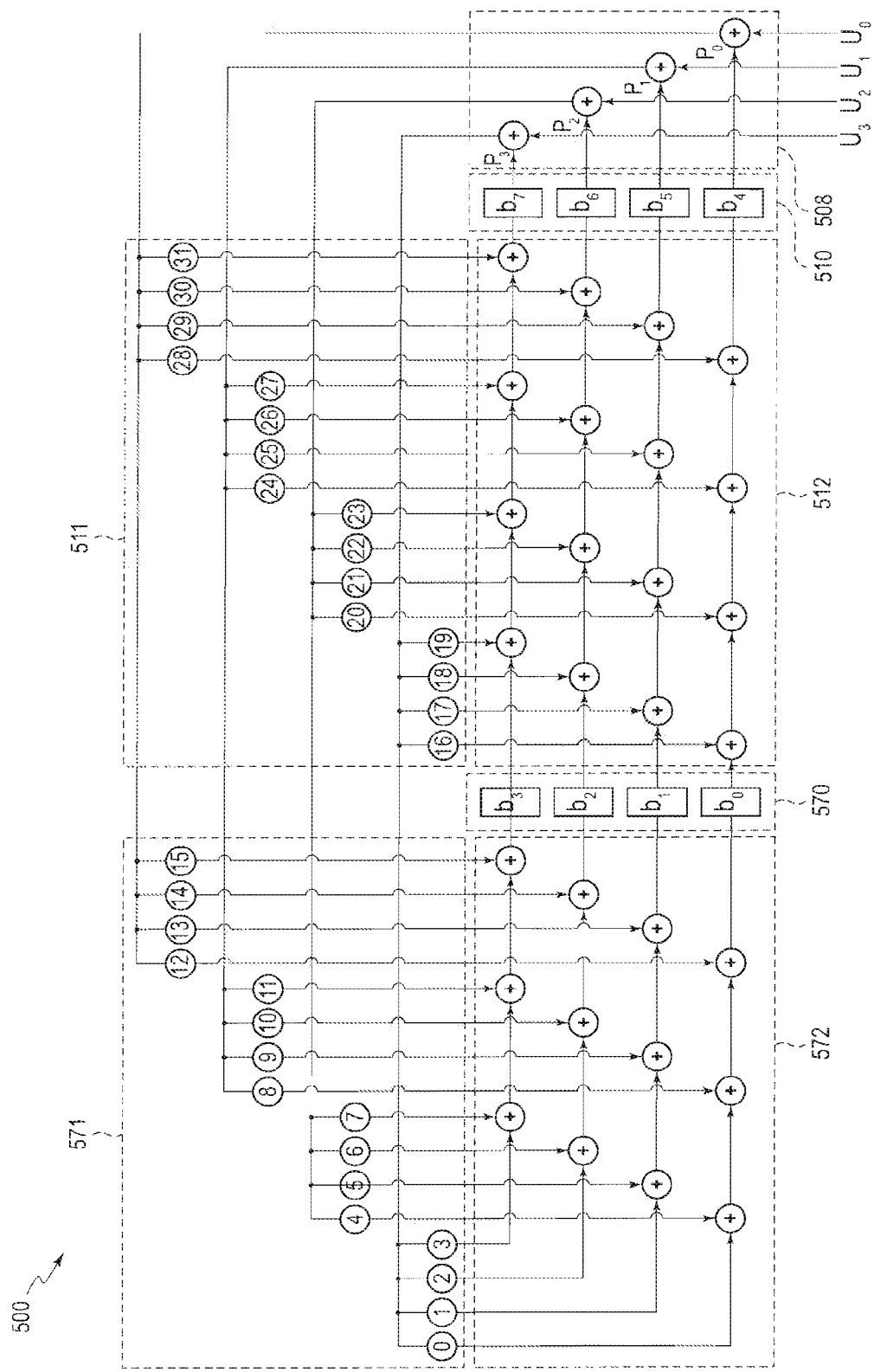
FIG. 5 shows an exemplary [6+3·i, 3·i] cyclic code encoder using W=3 bit words.
Figure 6:
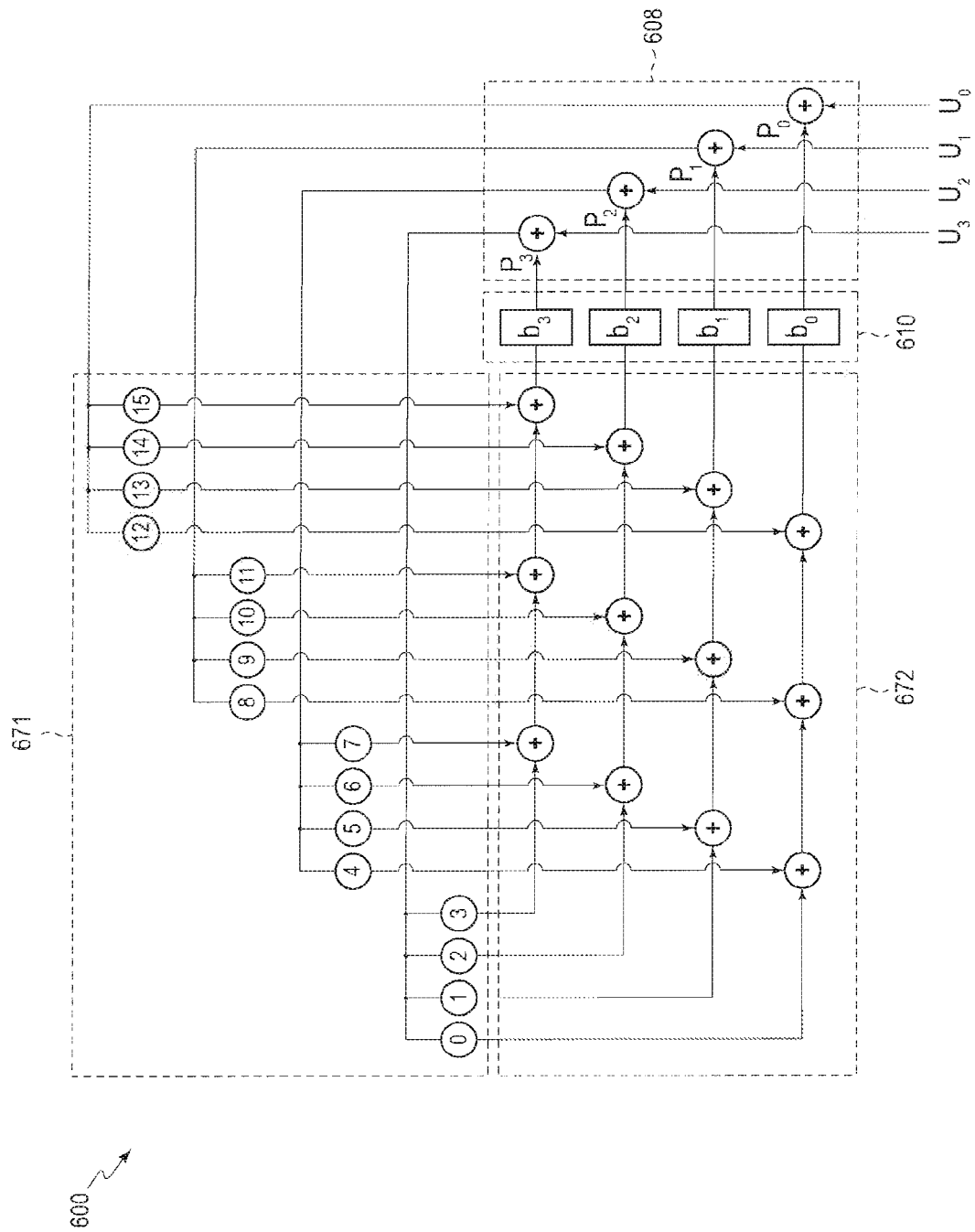
FIG. 6 shows an exemplary [4+4·i, 4·i] cyclic code encoder using W=4 bit words.

FIG. 3 and FIG. 6 will be used to discuss the encoding of this exemplary information vector with word-serial cyclic code encoder 200 using exemplary two bit and four bit words, respectively. The discussion of FIG. 6 will follow the discussion FIG. 4 and FIG. 5, which show 3 bit and 4 bit word word-serial cyclic code encoders, respectively, both having a plurality of word registers.

FIG. 3 shows an exemplary two-bit (i.e., W=2) word-serial cyclic encoder 300 containing an input adder 308, word registers 310 and 370, weight arrays 311 and 371, and adder arrays 312 and 372. FIG. 3 shows word-serial cyclic encoder 300 when an encode gate (not shown) is closed to allow feedback from input adder 308 to weight arrays 311 and 371.

Input adder 308 can include two XORs or binary adders and can be connected to word register 310 and to one or more two-bit input words with $U_1$ and $U_0$ being the most significant and least significant bits of the two-bit word, respectively. The output of input adder 308 can be a two-bit feedback word.

Each bit of the feedback word can connect to a weight coefficient of weight arrays 311 and 371. There can be two weight coefficients for each of the two bits in the feedback word per word register, i.e., $W^2 = 4$ weight coefficients total per word register.

The weight coefficients of weight array 371 can be denoted $c_0$, $c_1$, and $c_3$ and are numbered sequentially 0-3, as shown by the numerically inscribed circles of FIG. 3. The weight coefficients of weight array 311 can be denoted $c_4$, $c_5$, $c_6$, and $c_7$ and can be numbered sequentially 4-7, as shown by the numerically inscribed circles of FIG. 3.

The least significant and most significant bits of word register 370 can be denoted $b_0$ and $b_1$, respectively. Bits $b_0$ and $b_1$ can also be referred to as the state of the register, e.g. register 370. The least significant and most significant bits, i.e., the register state, of word register 310 can be denoted $b_2$ and $b_3$, respectively.

During operation of the two-bit word-serial cyclic encoder 300, a two-bit information word can arrive at input adder 308 and simultaneously can be output as $P_1$ and $P_0$ by word-serial cyclic encoder 300. Input adder 308 adds each input bit, $U_1$ and $U_0$, with the output $P_1$ and $P_0$ of word register 310. The initial value of variables $P_1$ and $P_0$ can be zero when word registers 310 and 370 are initialized by a zero feedback signal after an encode gate (not shown) opens the feedback path from input adder 308 to weight arrays 311 and 371.

Weight arrays 311 and 371 multiply the feedback signal by weight coefficients and route the weighted feedback signals to adder arrays 312 and 372. Adder array 312 connects two shift register bit paths, $b_0$ to $b_2$ and $b_1$ to $b_3$, through a string of adder elements of adder array 312. There can be up to 2 adders or XORs per shift register bit path. For word registers that are not the least significant word register, the number of adder elements in a bit path can equal the number of bits per word register, i.e., the register word width, W. For word registers that are the least significant word register, e.g., word register 370, the number of adder elements in a bit path, e.g., in adder array 371, can equal the number of bits per word register less one (i.e., W−1).

The critical path time or delay of the word-serial cyclic encoder 300 can be determined by adding the delay of one input adder XOR, the delay of an AND gate used to implement a weight coefficient, the delay of each of up to W=2 adder elements in adder array 311, and the setup time of word register 310. Since W=2 bits can be encoded per clock cycle, the average delay per bit encoded can be:

$$t_{2bits} = (3t_{XOR} + t_{AND} + t_{SETUP})/2 \quad \text{EQ. 6}$$

In an exemplary case, $t_{XOR}$=0.3 ns, $t_{AND}$=0.1 ns, and $t_{SETUP}$=0.2 ns. The average critical path delay from EQ. 6 for this exemplary case can be 0.6 ns versus a critical path delay of 0.9 ns for the bit serial cyclic encoder delay given by EQ. 3.

Continuing with the exemplary case of word-serial encoding of an [8,4] cyclic code, the weight coefficients generating two bit parity words for the generator polynomial $g(x)=1+x+x^2+x^4$, are $c_0=c_7=0$ and $c_1=c_2=c_3=c_4=c_5=c_6=1$. In the exemplary case of word-serial encoding of an [8,4] cyclic code, the weight coefficients generating two bit parity words for the generator polynomial $g(x)=1+x^2+x^3+x^4$, are $c_3=c_5=0$ and $c_0=c_1=c_2=c_4=c_6=c_7=1$. The validity of these weight coefficients can be verified by converting the cyclic code's generator matrix to systematic form, forming linear equations for each parity bit using sums of information bits, and assigning a unit weight to each information bit contribution to each sum for each parity bit.

The weight coefficients for the word-serial cyclic encoder 200 can also be found by power series expansion of the $j^{th}$ register's transfer function, $H_j(z)$, from the input, i.e., $U(z)$ to the $j^{th}$ register of the word-serial cyclic encoder 200. The transfer function $H_j(z)$ can be given by:

$$H_j(z) = [I + H_{N-1}(z)] \sum_{m=0}^{j} A_{(\frac{N}{W})-j+m} z^{-(m+1)} \quad \text{EQ. 7}$$

where $$H_{N-1}(z) = \left[I - \sum_{i=1}^{\frac{N}{W}} A_i z^{-i}\right]^{-1} \sum_{i=1}^{\frac{N}{W}} A_i z^{-i} \quad \text{EQ. 8}$$

can be the overall transfer function, $H_{N-1}(z)$, from the information word input to the parity word output, and where the information word and parity words can treated as column vectors. In equations 7 and 8, the symbol I can be an identity matrix and the subscripted A coefficients can be matrices corresponding to the weight arrays of word-serial cyclic encoder 200. For example, $A_1$ can denote a first weight array which is closest to a first word register that outputs the parity word, and $A_2$ can denote the next weight array which precedes a second word register that holds less significant, i.e., more delayed, states.

The word sequence corresponding to the inverse Z transform of each $H_j(z)$ can be found by power series expansion. Each term in the power series expansion can be a column vector that can be further expanded into a sequence in order of bit position. Each of W expansions for a given $j^{th}$ register, plus the known power series expansion of bit-serial cyclic encoder 100's transfer function, can provide a total of $C=W^2$ equations in $W^2$ unknowns. These equations can be solved for weight coefficients for weight array $A_j$. Thus, the solution to finding a total of number of weight coefficients, NW, can be decomposed into a number N/W matrix inversions. Accordingly, each coefficient of the complex variable $z^{-1}$ in the power series expansions of the word-serial cyclic encoder 200 can be matched to corresponding coefficients for the power series expansions of the transform of the bit-serial encoder 100.

Figure 4:
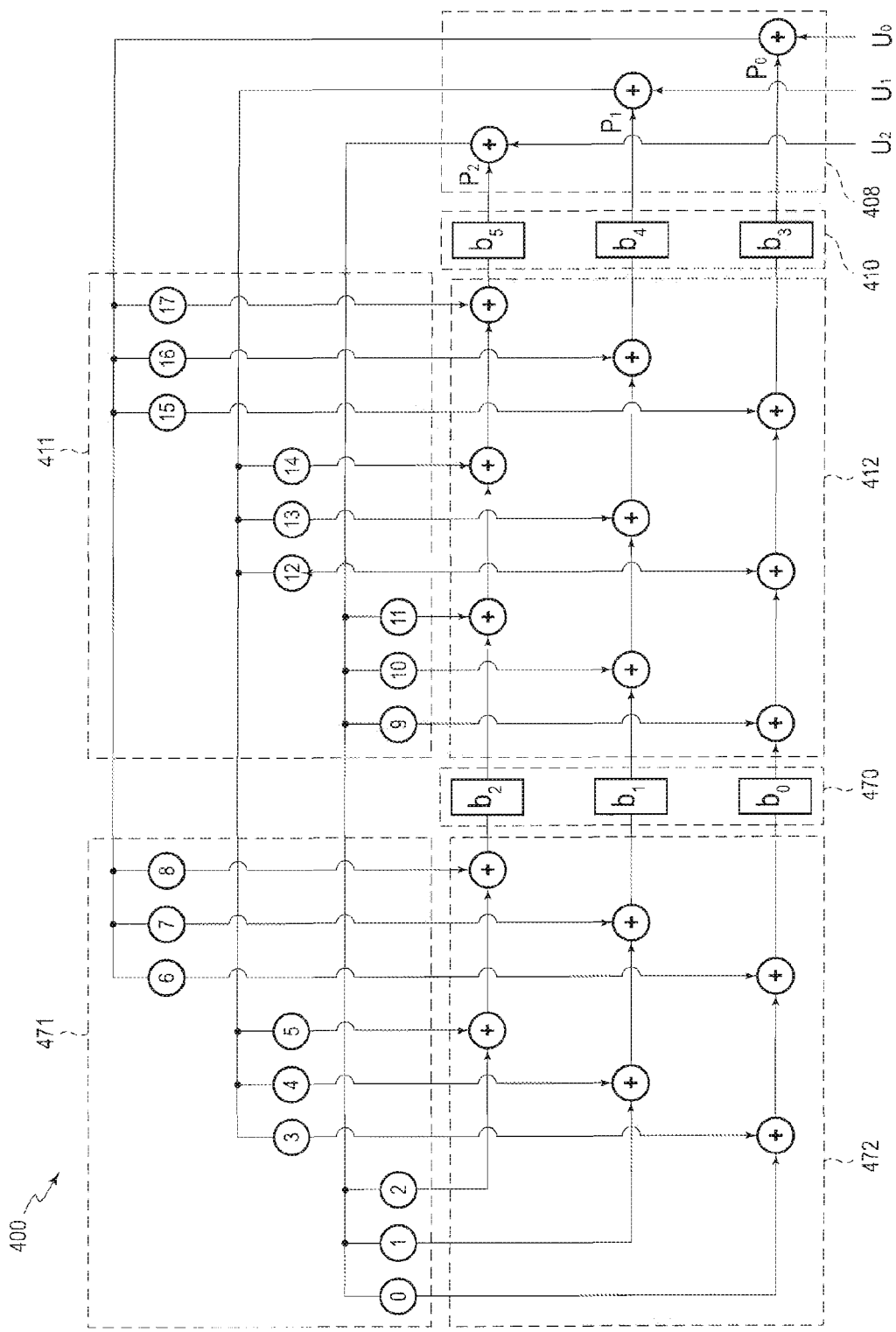
FIG. 4 shows an exemplary three-bit (i.e., W=3) word-serial cyclic encoder.

FIG. 4 shows an exemplary three-bit (i.e., W=3) word-serial cyclic encoder 400 containing an input adder 408, word registers 410 and 470, weight arrays 411 and 471, and adder arrays 412 and 472. FIG. 4 shows word-serial cyclic encoder 400 when an encode gate (not shown) is closed to allow feedback from input adder 408 to weight arrays 411 and 471.

Input adder 408 can include three XORs or binary adders and can be connected to word register 410 and to one or more three-bit input words with $U_2$ and $U_0$ being the most significant and least significant bits of the three-bit word, respectively. The output $P_2$, $P_1$, and $P_0$ of input adder 408 can be a three-bit feedback word.

Each bit of the feedback word can connect to a weight coefficient of weight array 411 and 471. There can be three weight coefficients for each of the three bits in the feedback word per word register, i.e., $W^2=9$ weight coefficients total per word register.

The weight coefficients of weight array 471 can be denoted $c_0$ to $c_8$ and can be numbered sequentially starting as shown by the numerically inscribed circles of FIG. 4. The weight coefficients of weight array 411 can be denoted $c_9$ to $c_{17}$ and can be numbered sequentially starting as shown by the numerically inscribed circles of FIG. 4.

The least significant and most significant bits of, i.e., the state of, word register 470 can be denoted $b_0$ and $b_2$, respectively. The least significant and most significant bits of, i.e., the state of, word register 410 can be denoted $b_3$ and $b_5$, respectively.

During operation of the three-bit word-serial cyclic encoder 400, a three-bit information word can arrive at inputs of input adder 408 and simultaneously can be output by word-serial cyclic encoder 400. Input adder 408 can add each input bit, $U_2$, $U_1$, and $U_0$, with the output $P_2$, $P_1$, and $P_0$, respectively of word register 410. The initial value of $P_2$, $P_1$, and $P_0$ can be zero when word registers 410 and 470 are initialized by a zero feedback signal after an encode gate (not shown) opens the feedback path from input adder 408 to weight arrays 411 and 471.

Weight arrays 411 and 471 can multiply the feedback signal by weight coefficients and can route the weighted feedback signals to adder arrays 412 and 472. Adder array 412 can connect three shift register bit paths, $b_0$ to $b_3$, $b_1$ to $b_4$, and $b_2$ to $b_5$, through a string of adder elements of adder array 412. There can be up to 3 adders or XORs per shift register bit path. For word registers that are not the least significant word register, the number of adder elements in a bit path can equal the number of bits per word register, W. For word registers that are the least significant word register, e.g., word register 470, the number of adder elements in a bit path, e.g., in adder array 471, can equal the number of bits per word register less one, i.e., W−1.

The critical path time or delay of the word-serial cyclic encoder 400 can be determined by adding the delay of one input adder XOR, the delay of an AND gate used to implement a weight coefficient, the delay of each of up to W=3 adder elements in adder array 411, and the setup time of word register 410. Since W=3 bits can be encoded per clock cycle, the average delay per bit encoded can be:

$$t_{3bits}=(4t_{XOR}+t_{AND}+t_{SETUP})/3 \quad \text{EQ. 9}$$

In an exemplary case, $t_{XOR}$=0.3 ns, $t_{AND}$=0.1 ns, and $t_{SETUP}$=0.2 ns. The average critical path delay from EQ. 9 for this exemplary case can be 0.5 ns versus a critical path delay of 0.9 ns for the bit serial cyclic encoder delay given by EQ. 3.

FIG. 5 shows an exemplary four-bit (i.e., W=4) word-serial cyclic encoder 500 containing an input adder 508, word registers 510 and 570, weight arrays 511 and 571, and adder arrays 512 and 572. FIG. 5 shows word-serial cyclic encoder 500 when an encode gate (not shown) is closed to allow feedback from input adder 508 to weight arrays 511 and 571. The structural form and operation of corresponding elements of word-serial cyclic encoder 500 can be inferred from the previous discussion of word-serial cyclic encoder 300 and word-serial cyclic encoder 400. The weight arrays 511,571 can each contain $W^2$=16 weight coefficients, and the shift register paths traversing adder array 511 can contain W=4 XORs, and adder array 572 can contain 3 XORs per input of word register 570. The bit average critical path delay of word-serial cyclic encoder 500 can be:

$$t_{4bits}=(5t_{XOR}+t_{AND}+t_{SETUP})/4 \quad \text{EQ. 10}$$

In an exemplary case, $t_{XOR}$=0.3 ns, $t_{AND}$=0.1 ns, and $t_{SETUP}$=0.2 ns. The average critical path delay from EQ. 10 for this exemplary case can be 0.45 ns versus a critical path delay of 0.9 ns for the bit serial cyclic encoder delay given by EQ. 3.

FIG. 6 shows an exemplary four-bit (i.e., W=4) word-serial cyclic encoder 600 containing an input adder 608, a single word register 610, weight array 671, and adder array 672. FIG. 6 shows word-serial cyclic encoder 600 when an encode gate (not shown) is closed to allow feedback from input adder 608 to weight array 671. The weight array 671 can contain $W^2$=16 weight coefficients, and adder array 672 can contain 3 XORs per input of word register 670.

Continuing with the exemplary case of word-serial encoding of an [8,4] cyclic code, the weight coefficients generating W=4 bit parity words for the generator polynomial g(x)=1+x+$x^2$+$x^4$, are $c_0$=$c_4$=$c_5$=$c_7$=$c_9$=$c_{10}$=$c_{11}$=$c_{12}$=$c_{13}$=$c_{14}$=1 and $c_1$=$c_2$=$c_3$=$c_6$=$c_8$=$c_{15}$=0. In the exemplary case of word-serial encoding of an [8,4] cyclic code, the weight coefficients generating W=4 bit parity words for the generator polynomial g(x)=1+$x^2$+$x^3$+$x^4$, are $c_0$=$c_3$=$c_5$=$c_6$=$c_8$=$c_9$=$c_{10}$=$c_{12}$=$c_{14}$=$c_{15}$=1 and $c_1$=$c_2$=$c_4$=$c_7$=$c_{11}$=$c_{13}$=0. The validity of these weight coefficients can be verified by converting the cyclic code's generator matrix to systematic form, expressing the parity bits as linear sums of the information bits, and assigning a unit weight for the contribution of each information bit in each sum for each parity bit. Other weight coefficients can have zero weight.

Figure 7A:
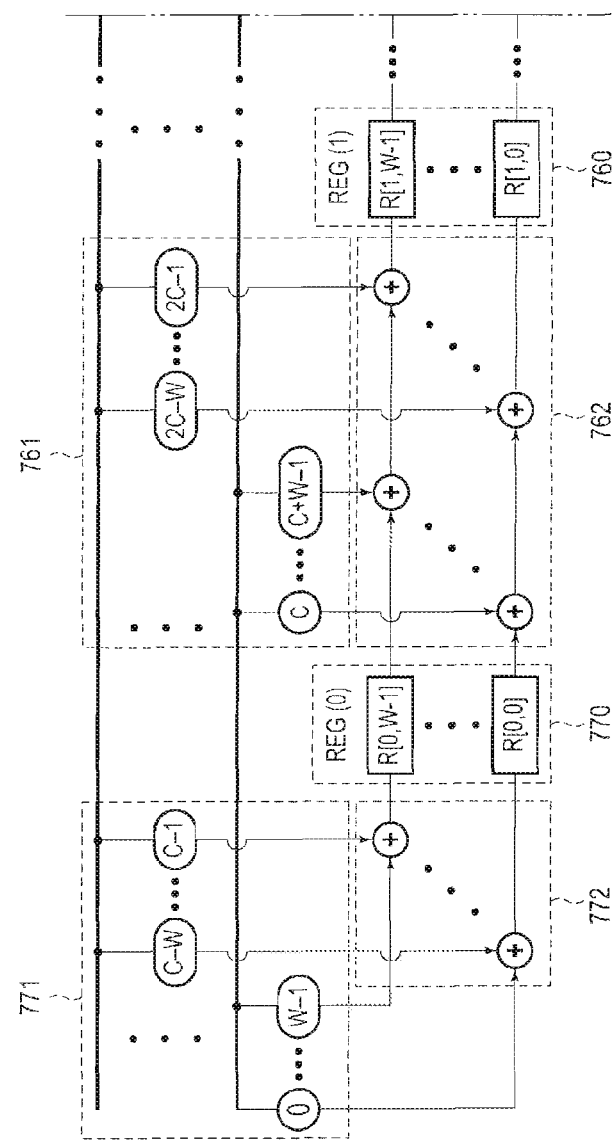
FIGS. 7A and 7B shows an exemplary [N+iW, iW] cyclic code encoder using W bit words.
Figure 7B:
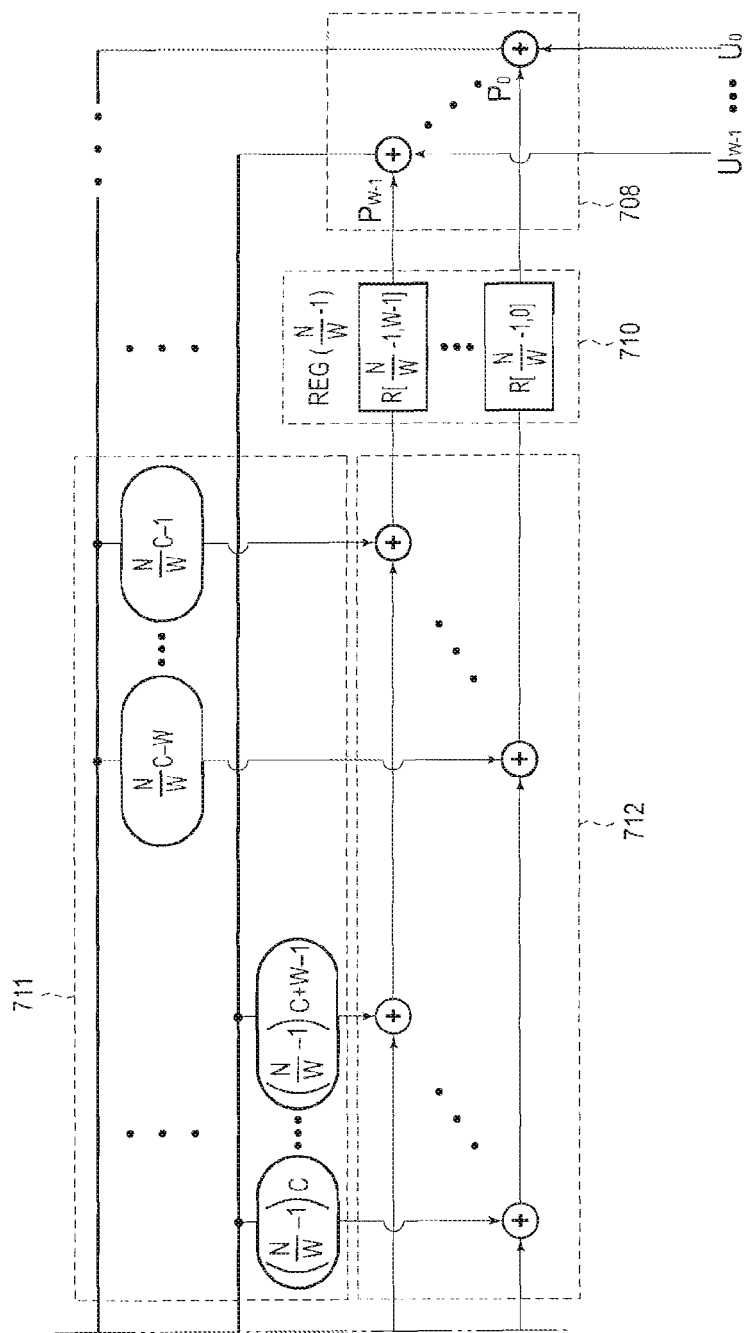

FIGS. 7A and 7B show an exemplary W-bit word-serial cyclic encoder 700 containing a plurality, e.g., N/W where N≧2W, of word registers, numbered from zero to N/W−1, where N=n−k is the number of parity bits to be generated. FIG. 7B is a continuation of FIG. 7A and is read with FIG. 7A on the left and FIG. 7B on the right. FIGS. 7A and 7B make significant use of ellipsis to indicate that large word widths can be accommodated.

FIGS. 7A and 7B show the W-bit word-serial cyclic encoder 700 can contain an input adder 708, word registers 710, . . . 760, 770, weight arrays 711, . . . 761, and 771, and adder arrays 712, . . . 761 and 772. FIGS. 7A and 7B show word-serial cyclic encoder 700 when an encode gate (not shown) is closed to allow feedback from input adder 708 to weight arrays 711, . . . 761, and 771. In FIGS. 7A and 7B, word register 710 can be a most significant word register from which parity words can emerge, word register 710 can be a least significant word register, and word register 760 can be an intermediate word register. Likewise, weight array 711, weight array 761, and weight array 771 can be a most significant weight array, an intermediate weight array, and a least significant weight array, respectively. There can be a plurality of intermediate word registers, weight arrays, and adder arrays as indicated by ellipsis in FIGS. 7A and 7B.

Each weight array of word-serial cyclic encoder 700 can contain C=$W^2$ weight coefficients, and each adder array, except the least significant adder array, can contain $W^2$ XORs, i.e., W XORs for each of the W shift register bit paths. The least significant adder array can contain $W^2$−W XORs. In an exemplary case, N=2040−1560=480 and W=12 so there can be N/W=40 word registers with 12 bits per register. In this exemplary case, each of the 40 weight arrays and each adder array, except the least significant adder array, can contain 144 weight coefficients and XORs, respectively. The least significant adder array can contain 132 XORs. In general there can be N−W weight coefficients total and N−W XORs, including W input adder XORs. In general, the critical path delay for W-bit wide word serial cyclic encoder 700 can be:

$$t_{W\text{-}bits}=((W+1)t_{XOR}+t_{AND}+t_{SETUP})/W \quad \text{EQ. 11}$$

According to EQ. 11, the clock speed for encoding a W-bit word can be 1/(W·$t_{W\text{-}bits}$). In an exemplary case, if the maximum clock speed of a W=1 bit (i.e., a bit-serial) cyclic code encoder is approximately 1 GHz, the word-serial cyclic encoder 700 can encode at a clock rate of approximately 215 MHz for a W=12 bit word and approximately 136 MHz for a W=20 bit word.

Figure 8:
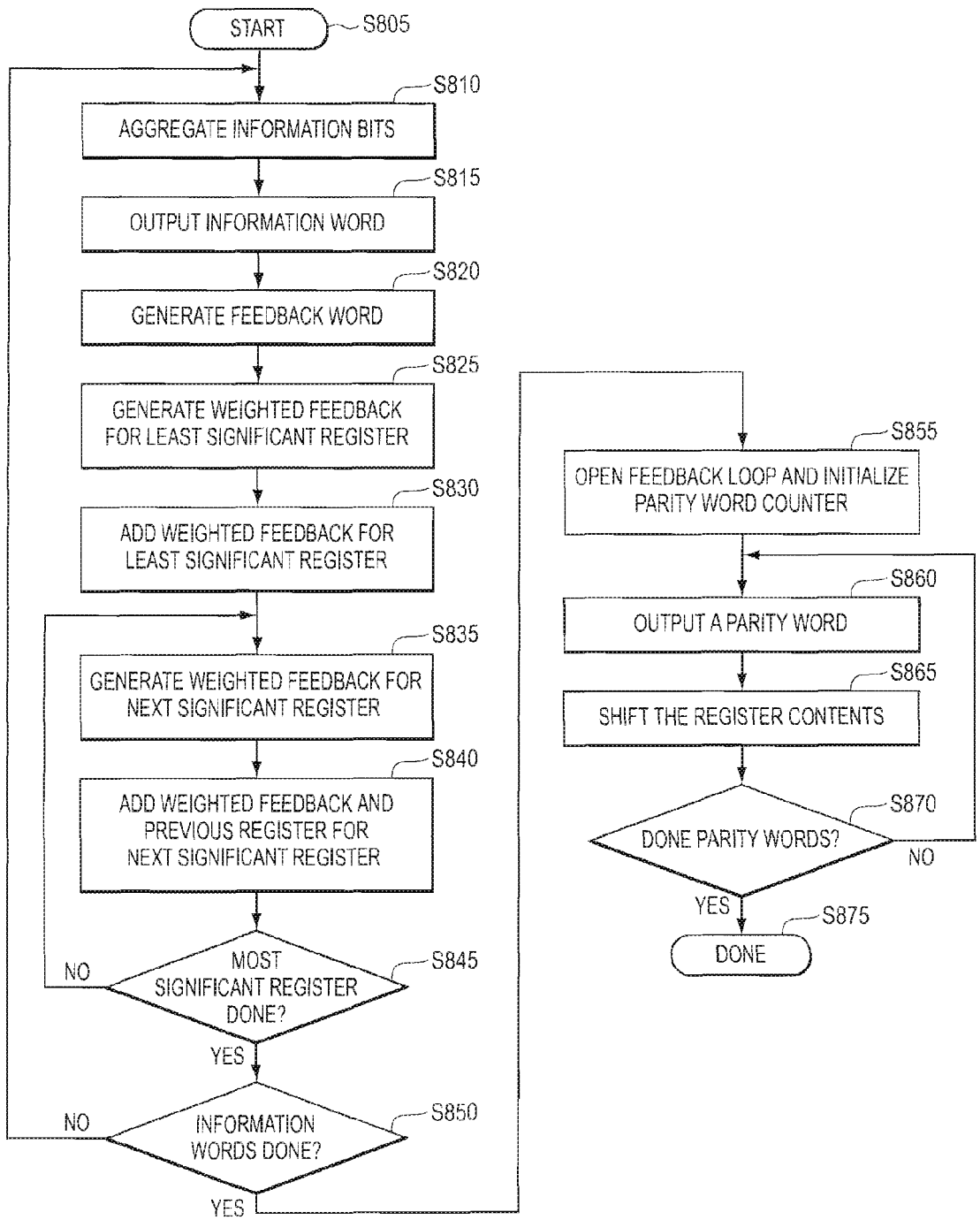
FIG. 8 shows a flowchart of an exemplary process for word-serial cyclic code encoding.

FIG. 8 shows a flowchart describing an exemplary process for word-serial cyclic code encoding. The flowchart and program flow can start with step S805 and can proceed to step S810 in which W information bits can be aggregated into a W-bit word. Program flow can proceed from step S810 to step S815 in which the information word can be sent to the encoder output. Program flow can then proceed to step S820 in which a feedback word can be generated (in one implementation) by exclusive-ORing (XORing) each bit of the information word with bits of corresponding significance in an output register word.

After step S820, program flow can proceed to step S825 in which the feedback word can be weighted by an array of weight coefficients for the register zero, i.e., the least significant register. After step S825, program flow can proceed to step S830 in which the bits of the weighted feedback word can be added together to form the input to each input bit of the least significant word register.

After step S830, program flow can proceed to step S835 in which the feedback word can be weighted by an array of weight coefficients for the $i^{th}$ register, i.e., the register indicated by the counter. After step S835, program flow can proceed to step S840 in which the bits of the weighted feedback word can be added together and to the output of the previous register, i.e., the $i^{th}-1$ register, to form the input to each input bit of the $i^{th}$ word register.

After step S840, program flow can proceed to step S845, which can test the count value against the maximum count, (N/W)−1 If the count value does not equal (N/W)−1, then program flow can return to step S835, otherwise program flow can proceed to step S850.

In step S850, the program can determine if all information words have been output. If not, program flow can return to step S810, otherwise program flow can proceed to step S855. In step S855, the program can open the feedback loop and program flow can proceed to step S860.

In step S860, the program can output a parity word from the most significant shift register and then proceed to step S865. In step S865, the shift word register contents can be shifted to the next most significant register and program flow can proceed to step S870. In step S870, the parity word number of parity words that have been output can be checked and if not all words have been output, program flow can return to step S860, otherwise program flow can proceed to step S875 and terminate.

While the techniques above have been described in conjunction with specific implementations, many alternatives, modifications, and variations can be made. Accordingly, implementations as set forth herein are intended to be illustrative and not limiting. There are changes that may be made without departing from the spirit and scope of the invention.

What is claimed is:

1. An encoder configured to encode cyclic codes, the encoder comprising:
a first word register and a second word register each having an input and an output;
an input adder that is coupled to the output of the first word register, the input adder being configured to receive input words and to output corresponding feedback words;
a first adder array that is coupled between the input of the first word register and the output of the second word register;
a feedback loop that is configured to selectively transmit feedback words to the input of the second word register and an input of the first adder array;
a controller that is configured to cause the encoder to operate in an input mode and an output mode, during the input mode, feedback words are sequentially transmitted on the feedback loop, a number of bits per a feedback word being different from a word width of at least one of the first and second registers, and states of the first word register and the second word register are updated, while during the output mode, states of the first word register and the second word register are sequentially shifted out of the first word register as parity words; and
a multiplexer to output the input words and parity words from the encoder such that each parity word is appended to a corresponding input word.

2. The encoder according to claim 1, wherein a final state of the first word register is a most significant parity word and a final state of the second word register is a least significant parity word.

3. The encoder according to claim 1, further comprising:
at least one intermediate word register having an input and output, the intermediate word register being located between the output of the second word register and the input of the first word register; and
an intermediate adder array that is coupled between the input of the intermediate word register and the second word register.

4. The encoder according to claim 3, wherein during the input mode, feedback words are sequentially transmitted on the feedback loop and the state of the intermediate word register is updated, while during the output mode, a final state of the intermediate word register is shifted out of the first word register as a parity word.

5. The encoder of claim 1, further comprising:
a gate that is included in the feedback loop, the gate being configured to transmit feedback words from the input adder to a first weight array and a second weight array during the input mode, the first weight array and the second weight array to respectively weight corresponding feedback words.

6. The encoder of claim 5, wherein, during the input mode, the controller causes the gate to be in a closed state to transmit feedback words from the input adder to the first weight array and the second weight array, and, during the output mode, the controller causes the gate to be in an open state.

7. The encoder of claim 6, wherein the multiplexer is configured to transmit input words to a codevector during the input mode.

8. The encoder of claim 7, wherein, during the output mode, the multiplexer transmits parity words from the first word register to the codevector.

9. The encoder of claim 5, wherein the first weight array and the second weight array each contain a number of weight coefficients equal to the square of a width of a register word.

10. The encoder of claim 1, wherein the first adder array contains a number of modulo-2 adders equal to the square of a width of a register word.

11. The encoder of claim 5, wherein the first weight array and the second weight array are programmable.

12. The encoder of claim 11, wherein each of the first weight array and the second weight array further comprise:
a first set of multipliers that are configured to apply a first set of binary weights to feedback words to generate first weighted feedback words and couple the first weighted feedback words to the input of the first word register; and
a second set of multipliers that are configured to apply a second set of binary weights to the feedback words to generate second weighted feedback words and couple the second weighted feedback words to the input of the second word register.

13. A method for encoding cyclic codes, the method comprising:
during an input mode:
adding a state of a first word register with an input word to generate a corresponding feedback word,
transmitting the feedback word to the first word register and a second word register, a number of bits per a feedback word being different from a word width of at least one of the first and second registers,
weighting the feedback word by a first weight array prior to the feedback word being received by the first word register, weighting the feedback word by a second weight array prior to the feedback word being received by the second word register, updating a state of the second word register based on the weighted second feedback word, and updating a state of the first word register based on the weighted first feedback word and the state of the second word register;

during an output mode:

sequentially shifting states of the first and second word registers out of the first word register as parity words, and appending the parity words to an input word.

14. The method of claim 13, further comprising:

programming a set of weight coefficients of the first weight array and the second weight array from initial values of the weight coefficients.

15. The method of claim 14, wherein the programming the first weight array and the second weight array further comprises:

programming a first set of binary weights applied to the feedback word to generate a first weighted feedback; and programming a second set of binary weights applied to the feedback word to generate a second weighted feedback.

16. A storage device, comprising:

a memory medium;

an interface coupled to the memory medium that includes:

a first word register and a second word register each having an input and an output, an input adder that is coupled to the output of the first word register and configured to receive input words and to output a corresponding feedback word, a first adder array that is coupled between the input of the first word register and the output of the second word register, a feedback loop that is configured to selectively transmit weighted feedback words to the input of the second word register and an input of the first adder array;

a controller that is configured to cause the storage device to operate in an input mode and an output mode, during the input mode, feedback words are sequentially transmitted on the feedback loop, a number of bits per a feedback word being different from a word width of at least one of the first and second registers, and states of the first word register and the second word register are updated, while during the output mode, states of the first word register and the second word register are shifted out of the first word register as parity words; and a writing device that is configured to write a codevector to the memory medium, the codevector including the input words and the parity words.

17. The storage device according to claim 16, wherein the memory medium is as least one of a magnetic disk, a magnetic tape, an optical disk, and a magneto-optical disk.

* * * * *